United States Patent
Sunkavalli et al.

(10) Patent No.: US 9,443,584 B2
(45) Date of Patent: Sep. 13, 2016

(54) NETWORK INTERFACE WITH LOGGING

(71) Applicant: ADESTO TECHNOLOGIES CORPORATION, Sunnyvale, CA (US)

(72) Inventors: Ravi Sunkavalli, Cupertino, CA (US); Malcolm Wing, Palo Alto, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 940 days.

(21) Appl. No.: 13/716,357

(22) Filed: Dec. 17, 2012

(65) Prior Publication Data

US 2014/0173154 A1    Jun. 19, 2014

(51) Int. Cl.
*G06F 13/40* (2006.01)
*G06F 11/00* (2006.01)
*G11C 13/00* (2006.01)
*G06F 15/16* (2006.01)
*G06F 15/177* (2006.01)

(52) U.S. Cl.
CPC ....... *G11C 13/0011* (2013.01); *G06F 13/4027* (2013.01); *G06F 13/4068* (2013.01); *G06F 15/177* (2013.01)

(58) Field of Classification Search
CPC .......... G06F 13/4027; G06F 13/4068; G06F 15/16; G06F 15/177; G11C 11/00
See application file for complete search history.

(56) References Cited

U.S. PATENT DOCUMENTS

| | | | | |
|---|---|---|---|---|
| 7,289,350 B2* | 10/2007 | Roehr | ............... | G11C 11/16 365/148 |
| 8,649,205 B2* | 2/2014 | Peters | ............. | G11C 11/1673 365/100 |
| 8,707,104 B1* | 4/2014 | Jean | ................ | G06F 11/1048 714/41 |
| 2007/0171697 A1* | 7/2007 | Hoenigschmid | .... | G11C 13/0011 365/148 |
| 2009/0271466 A1* | 10/2009 | Fields | ................... | G06F 9/54 709/201 |
| 2012/0216079 A1* | 8/2012 | Fai | .................... | G06F 11/362 714/42 |
| 2012/0297107 A1* | 11/2012 | Mathew | .......... | G06F 13/4221 710/313 |
| 2014/0047165 A1* | 2/2014 | Nemazie | ......... | G06F 12/0246 711/103 |

* cited by examiner

*Primary Examiner* — Henry Tsai
*Assistant Examiner* — Christopher A Daley
(74) *Attorney, Agent, or Firm* — Michael C. Stephens, Jr.

(57) ABSTRACT

Structures and methods for improving logging in network structures are disclosed herein. In one embodiment, an apparatus can include: (i) a network interface card (NIC) configured to receive data, to transmit data, and to send data for logging; (ii) a memory log coupled to the NIC, where the memory log comprises non-volatile memory (NVM) configured to write the data sent for logging from the NIC; and (iii) where the data being sent for logging by the memory log occurs substantially simultaneously with the data being received by the NIC, and the data being transmitted from the NIC.

20 Claims, 12 Drawing Sheets

NETWORK INTERFACE WITH LOGGING

FIELD OF THE INVENTION

The present invention generally relates to the field of network data logging. More specifically, embodiments of the present invention pertain to simultaneous network logging by using non-volatile memory (NVM).

BACKGROUND

NVM is increasingly found in applications, such as solid-state hard drives, removable digital picture cards, and so on. Flash memory is the predominant NVM technology in use today. However, flash memory has limitations, such as a relatively high programming current, as well as physical degradation of the memory cell over time. Other NVM technologies, such as resistive RAM (ReRAM) and conductive bridging RAM (CBRAM), may offer relatively low power and higher speeds as compared to flash memory technologies. CBRAM utilizes a programmable metallization cell (PMC) technology, which has the potential to scale to smaller sizes than flash memory devices.

SUMMARY

Embodiments of the present invention relate to network logging using non-volatile memory (NVM).

In one embodiment, an apparatus can include: (i) a network interface card (NIC) configured to receive data, to transmit data, and to send data for logging; (ii) a memory log coupled to the NIC, where the memory log includes NVM configured to write the data sent for logging from the NIC; and (iii) where the data being sent for logging by the memory log occurs substantially simultaneously with the data being received by the NIC, and the data being transmitted from the NIC.

In one embodiment, an apparatus can include: (i) a peripheral component interconnect express (PCIe) bridge configured to receive data, to resend the data, and to send data for logging; (ii) a PCIe device configured to receive the data that is resent from the PCIe bridge; (iii) a memory log coupled to the PCIe bridge, wherein the memory log includes NVM configured to write the data sent for logging from the PCIe bridge; and (iv) where the data being sent for logging by the memory log occurs substantially simultaneously with the data being received by the PCIe bridge, and the data being resent from the PCIe bridge.

In one embodiment, a method can include: (i) receiving data in a NIC; (ii) logging data from the NIC by writing data in a memory log, wherein the memory log includes NVM for writing the data for logging from the NIC; and (iii) transmitting data from the NIC, where the data is received by the NIC, the data is transmitted from the NIC, and the data is written for logging by the memory log substantially simultaneously.

Embodiments of the present invention can advantageously provide for reduced latency and improved performance relative to conventional approaches. Particular embodiments are suitable for network applications that may suffer from crashes where data is to be retained for subsequent recovery. These and other advantages of the present invention will become readily apparent from the detailed description of preferred embodiments below.

DETAILED DESCRIPTION OF EMBODIMENTS

Figure 1:
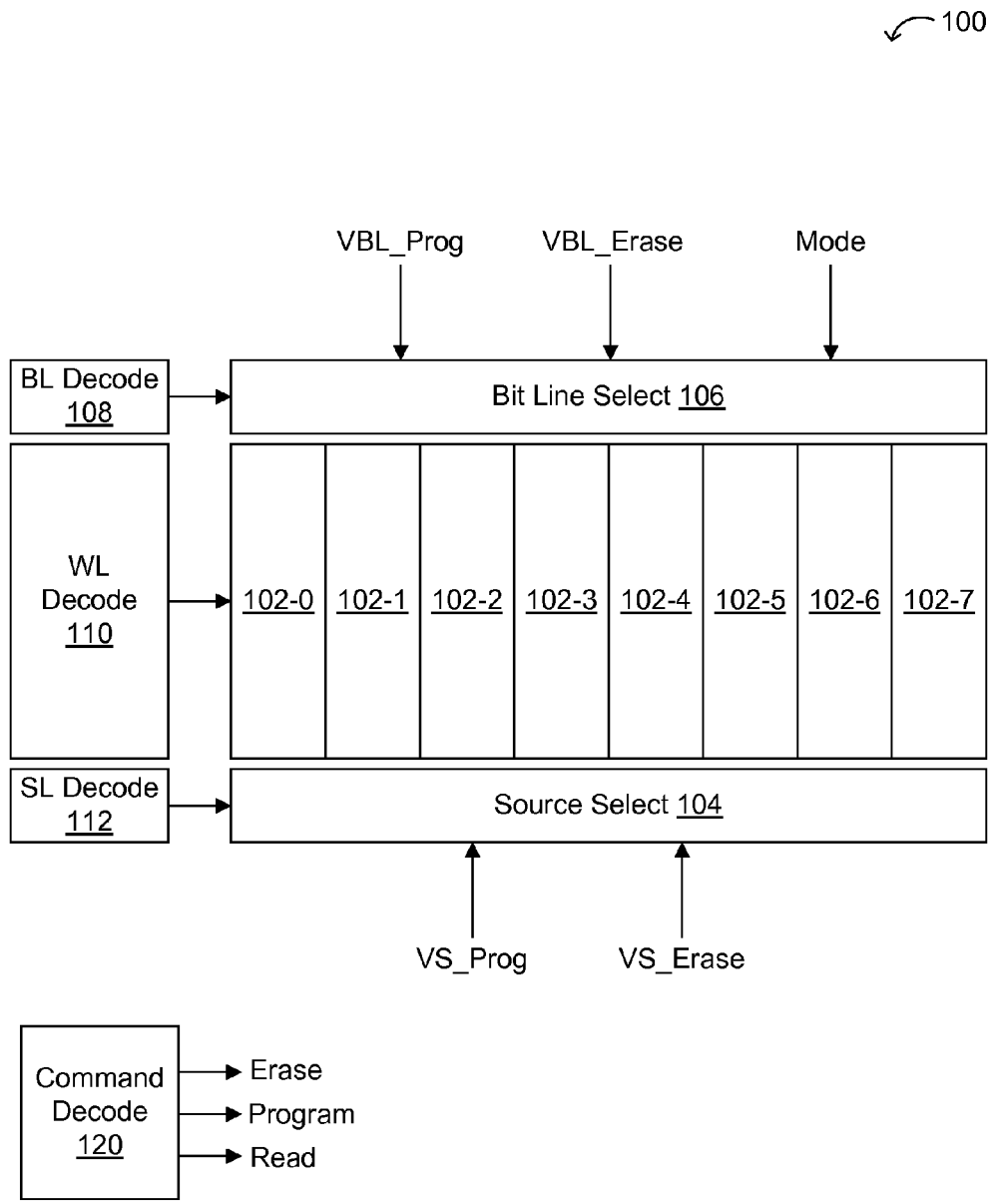
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating PMCs that can be programmed/written and erased between one or more resistive and/or capacitive states.

Figure 2:
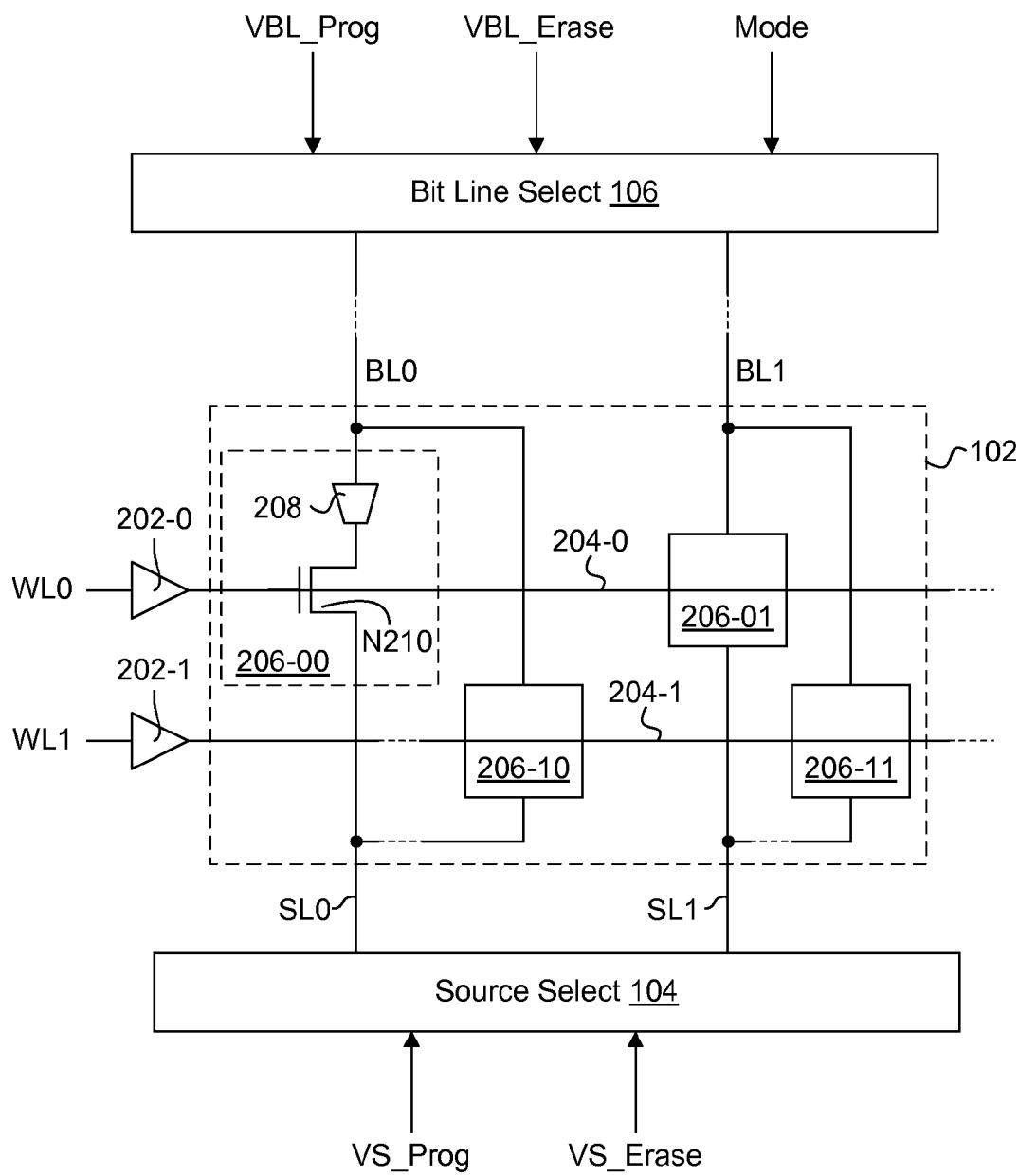
FIG. 2 is a diagram of an example memory device and memory cell structure.

FIGS. 1 and 2 show example memory architectures and circuit structures that can utilize PMCs of particular embodiments. However, PMCs of particular embodiments are suitable for use in a wide variety of memory architectures, circuit structures, and applications. In addition, particular embodiments are suitable to a wide variety of memory types, including both non-volatile memory (NVM), and in some cases volatile types of memory. Thus, PMC represents only one particular example of an NVM that can be utilized in memory cells for network logging in certain embodiments.

Referring now to FIG. 1, an example memory device is shown and designated by general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, recovery, etc.) in response. Such internal operation control signals can be used to generate various supply levels (e.g., particular program and erase voltage levels), as well as other control signals (e.g., recovery operation control signals), as will be discussed in more detail below. For example, a recovery command may be used to initiate recovery of data after a semiconductor memory device (e.g., including PMC-based memory cells) is mounted to a printed-circuit board (PCB). In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

PMC sectors (102-0 to 102-7) may also utilize a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be generated power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage generator (e.g., based on a reference voltage) of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1-V2) in an anode-to-cathode direction. In an erase operation, a PMC to be erased can be connected between suitable voltages (e.g., V2-V1) in an anode-to-cathode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be an erase voltage, which may both be a supply voltage (Vprog=V1-V2, Verase=V2-V1, Supply voltage=V2-V1). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell 206, thus placing its corresponding access device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation, in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltages and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
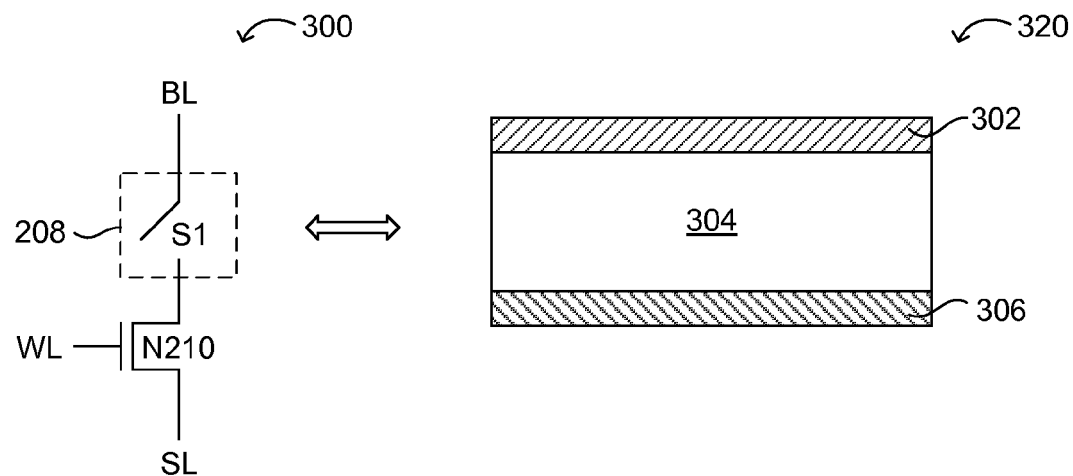
FIG. 3 is a diagram of an example programmable impedance element with schematic modeling.
Figure 3:
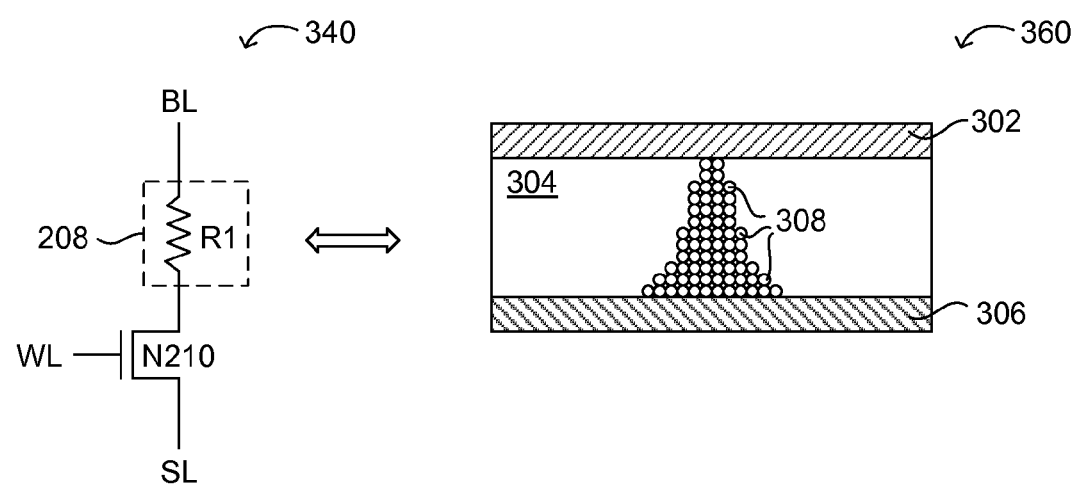

Referring now to FIG. 3, shown is a diagram of an example programmable impedance element with corresponding schematic modeling. Example 300 shows a memory cell with an open switch 51 representation of PMC 208. The PMC portion of this representation corresponds to the cross-section diagram 320, which represents a PMC or programmable impedance element in a high impedance state (e.g., state "1"), or an erased state. Cross-section diagram 320 may also represent a "virgin" storage element state, whereby the PMC or programmable impedance element has not previously been effectively programmed. For example, a virgin storage element state may be one in which the memory cell has not been through a pre-conditioning or formation step where a formation voltage ($V_{FM}$) that is higher than a standard program voltage is used to initially program the cell. Partially dissolved or erased states may also be detected as a data state "1," or a multi-bit value, in some applications, and depending on the read-trip point. As used herein, "PMC" may be one example of a "programmable impedance element." In this example, PMC 320 can include electrochemically active electrode 302, solid electrolyte 304, and inert electrode 306.

Schematic representation 340 and corresponding cross-section diagram 360 show examples of PMC 208 in a low impedance state (e.g., state "0"), or a programmed state. Partial conductive paths may also be detected as a data state "0," or a multi-bit value, in some applications, and depending on the read-trip point. Example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in examples 300 and 340, a control transistor (e.g., N210) can also be included in each memory cell including the programmable impedance element or PMC 208. For example, transistor N210 can be controlled by a word line 204, as discussed above with respect to FIG. 2.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes.

Solid electrolyte 304 can include a chalcogenide compound, such as a germanium selenium (Ge—Se) compound. Solid electrolyte 304 can be formed by photodissolution of metal into a chalcogenide base glass. Chalcogenide materials are chemical compounds consisting of at least one chalcogen ion (a chemical element in column VI of the periodic table, also known as the oxygen family). More precisely, the term chalcogenide refers to the sulphides, selenides, and tellurides. PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias. Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

Various materials can be utilized to form electrodes 302 and 306. For example, inert electrode 306 can include tungsten, and electrochemically active electrode 302 can include silver or copper. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 µA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "0" data value stored in that cell. However, if there is no nanowire or conductive path between electrodes in the cell (e.g., 320), the resistance is higher, leading to low current, and that can be read as a "1" data value stored in that cell. Of course, the definitions of "0" and "1" data values versus resistance levels can be reversed in some applications.

Cell data can be erased in similar fashion to cell writing or programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC can be substantially symmetric to a program or write operation.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage in may produce a trail of conducting defects (a "filament"). Thus, for CBRAM, one electrode provides the dissolving ions, while for ReRAM, a one-time "forming" step may be required to generate the local damage.

Various types of memories may be utilized in network logging applications. However, a common structure includes separated permanent memory from a network interface card (NIC), with sequential logging operations. In particular embodiments, non-volatile memory (NVM), such as a CBRAM or ReRAM, can be utilized to provide network logging capability for an NIC. Such a more integrated NVM-based logging memory also allows for simultaneous operations, thus reducing latency and improving performance.

Example Network Interface with Logging

In particular embodiments, an NVM memory log can be written to, while simultaneously transmitting the data from the NIC. Thus, a single step or overlapping step network data logging operation can be accommodated in particular embodiments. For example, the non-volatile memory log can be an external chip on a same network card as the NIC, or may be embedded within a same chip (e.g., NIC) that handles the network transmission and reception. Such simultaneous network data logging can allow for reduced latencies, and improved network performance.

In particular embodiments, an NIC or a bridge may be combined with permanent memory, such as a suitable type of NVM (e.g., CBRAM), that acts as a memory log for network data. CBRAM may be suitable for this application due to being bit-writable and addressable, with relatively high density and high speeds. CBRAM may also be substantially faster than other NVM approaches, and can be tailored to support one or more of multiple modes of operation. For example, one mode of CBRAM operation includes traditional use cases of flash type NVM (e.g., endurance on the order of 10-100,000-1M write cycles, and retention on the order of 10-100 years). Further, CBRAM may be modified to operate in a DRAM/SRAM regime with relatively fast write times, and retention on the order of, e.g., days, hours, or weeks.

Thus, the endurance of a CBRAM configured for network memory log applications may be configured to be between that of a DRAM and that of a more conventional type of NVM. The CBRAM can essentially be tweaked so that the endurance (e.g., number of allowed write cycles) increases, while the retention is reduced. For example, these CBRAM modifications can be accomplished by adjusting control voltages, currents, as well as by adjusting some processing steps. Further, because a network crash event is likely to be noticed relatively quickly, a fast memory with higher write cycle endurance may be suitable, even with a somewhat reduced retention time.

Figure 4:
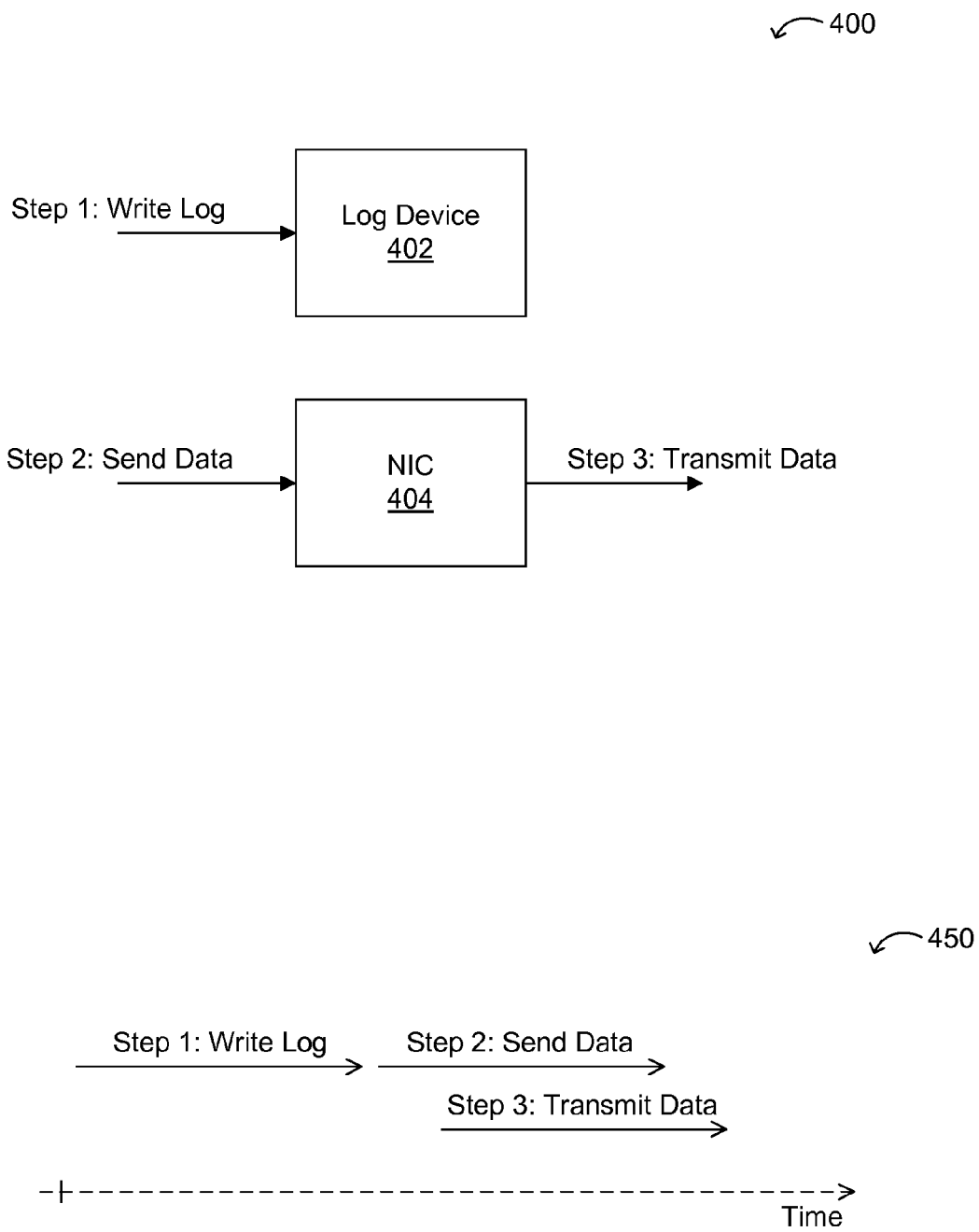
FIG. 4 is a diagram of an example of a separate log and network interface card (NIC) with operational timeline.

Referring now to FIG. 4, shown is a diagram of an example of a separate log and network interface card (NIC) with operational timeline. In example 400, log device 402 is shown as receiving write log information in step 1. As used herein, a "step" may indicate one or more operations involved in the designated step. The "write log" step 1 can include network data or transactions sent to a storage device (e.g., log device 402) with a write operation in order to store the network data. NIC 404 can receive the sent data in step number 2, while data can be transmitted from NIC 404 in step 3. For example, the "send data" received by NIC 404 in step 2 can be data sent from another network node or network device to the present NIC. Also, the "transmit data" that is sent by NIC 404 in step 3 can be data that is transmitted to another network node or network device (not shown).

As shown in the associated timeline diagram 450, the write log can occur in advance of data being sent to the NIC, as well as data being transmitted from the NIC. Thus, steps 2 and 3 can occur after the write log step has been completed. For systems that require certain information sent out on a network card to be logged, this example approach writes the data to a separate non-volatile log (e.g., log device 402), and subsequently transmits the data (e.g., to/from NIC 404). As shown in timeline example 450, these steps occur essentially as a two-step or non-overlapping process.

In one embodiment, an apparatus can include: (i) an NIC configured to receive data, to transmit data, and to send data for logging; (ii) a memory log coupled to the NIC, where the memory log includes NVM configured to write the data sent for logging from the NIC; and (iii) where the data being sent for logging by the memory log occurs substantially simultaneously with the data being received by the NIC, and the data being transmitted from the NIC.

Figure 5:
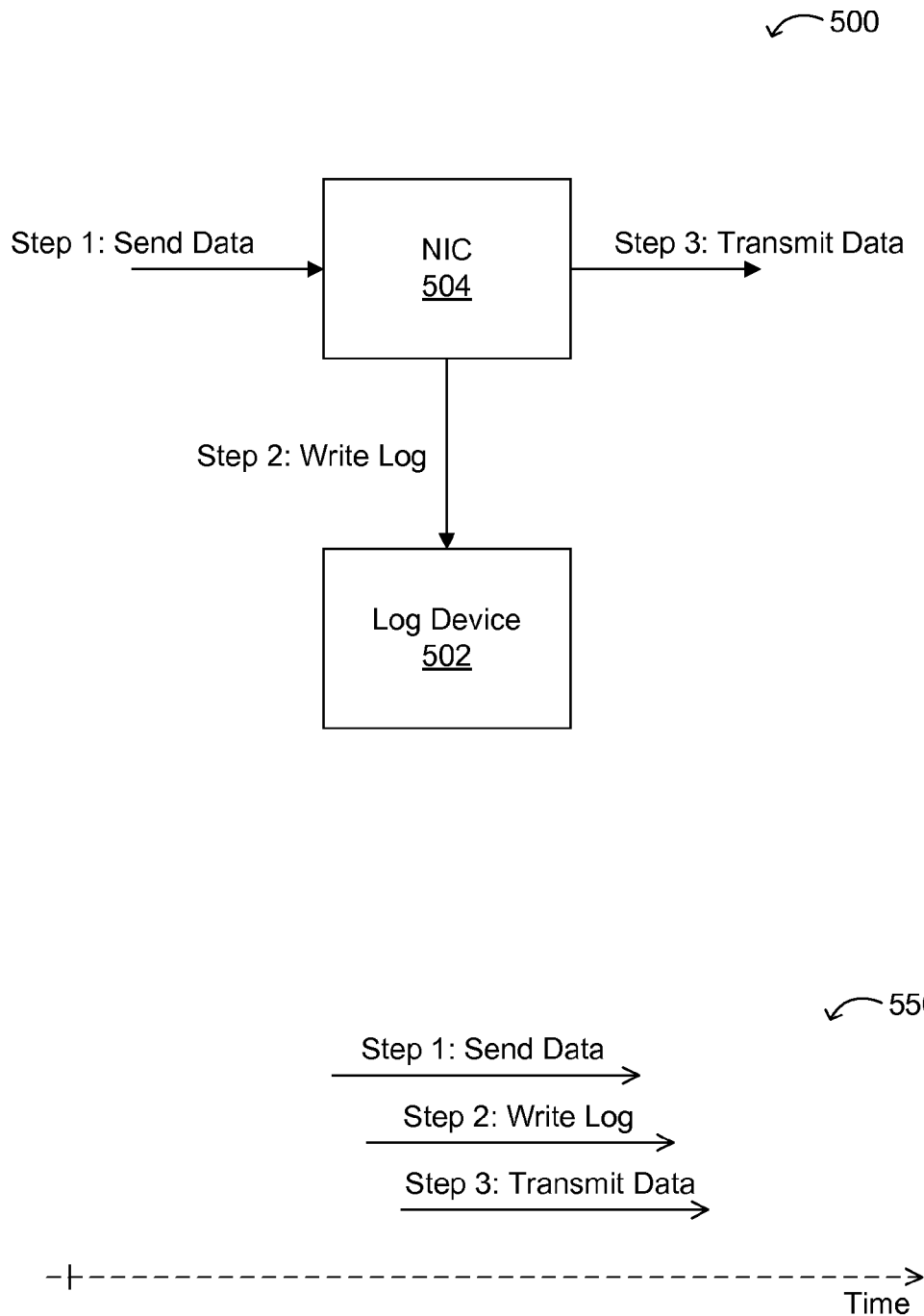
FIG. 5 is a diagram of an example logging NIC in accordance with embodiments of the present invention.

Referring now to FIG. 5, shown is a diagram of an example logging NIC in accordance with embodiments of the present invention. In example 500, NIC 504 can receive the sent data in step 1, send data to log device 502 to write the data logged in step 2, and transmit the data in step 3. As discussed above, the "send data" that is received in step 1 by NIC 504 can include any network data or information that is transmitted from another network node or device to NIC 504. Also, "write log" can include data or network transaction information to be stored or written to log device 502. For example, log device 502 may be a non-volatile type of memory log, such as a CBRAM or ReRAM. In addition, "transmit data" sent from NIC 504 may be sent to another network node or device (not shown).

As shown in timeline example 550, the sending of the data, the writing of the log, and the transmitting of the data, can occur substantially simultaneously. As used herein, "substantially simultaneously" may indicate that two steps or operations overlap at least in part in time, and do not occur in a strictly sequential fashion. As shown in 550, each of the sending of the data, the writing of the log, and the transmitting of the data, may overlap in large part, thus representing operation that occurs substantially simultaneously. Thus, essentially a single step or overlapping operational process for network memory logging can be accommodated in particular embodiments.

In this way, a logging NIC (controller/card) where network transactions are logged in combination with NVM can be accommodated in particular embodiments. This can be done because, e.g., CBRAM is relatively high speed, and may include implementation on one chip, or on separate chips on the same card. For example, the write to the log (e.g., CBRAM, or any other fast NVM that can keep up with network traffic) can occur at substantially the same time as network traffic is processed in the NIC. Logs may thus be implemented in NVM to allow recovery (e.g., financial applications, crash, etc.) of the data that would otherwise possibly be lost due to some type of system crash. In one application, a log may allow a system to determine a status or state in a certain distributed algorithm. For example, an electronic trading system may log orders and cancelations that the trading system sends to an exchange, and a distributed coordination algorithm can log key messages that are sent to other systems. After a system crash, the log may allow the related systems to more quickly ascertain the situation, and to substantially reduce recovery latency as part of the recovery operation. Such NVM suitable for recovery operations can be referred to as "permanent memory," which can also be combined with NIC 504.

The NIC may be a card or chip that receives and/or sends out data. A NIC may be referred to as a network interface controller, a network interface card, a network adapter, a local area network (LAN), adapter and so on. An NIC is a computer hardware component that can connect (e.g., via cables or wirelessly) a computer to a computer network, and may implement circuitry for communication using a specific physical layer and data link layer standard (e.g., Ethernet, Wi-Fi, token ring, etc.). This provides a base for a full network protocol stack, and may allow for communication among groups of computers on the same LAN, and large-scale network communications through routing protocols (e.g., Internet protocol [IP]). Thus, an NIC can allow computers to communicate over a computer network. An NIC may be both an OSI layer 1 (physical layer) and layer 2 (data link layer) device, providing a physical access to a networking medium, and a low-level addressing system through use of media access control (MAC) addresses.

In addition, a bridge can provide a function of logging network data or transactions to memory, and also transferring data to the NIC. In this way, particular embodiments can provide for simultaneous writing or single step (e.g., overlapping) operation whereby writing occurs as the NIC receiving and/or transmitting data. This arrangement can reduce latency and improve network performance by overlapping operational steps. In one example of non-overlapping operation, a write operation can occur to a separate permanent memory, such as NV memory card or disk, and only then may be packet be sent from the NIC. However, particular embodiments allow for NVM-based logging with an NIC to enable single step or overlapping operation. Thus, in particular embodiments NVM may be located within, or closely associated with, the NIC. Logging may be implemented as part of or essentially as a side effect of sending and/or transmitting data. Thus, single or substantially overlapping transfer operations including memory log writing can occur in particular embodiments.

Figure 6:
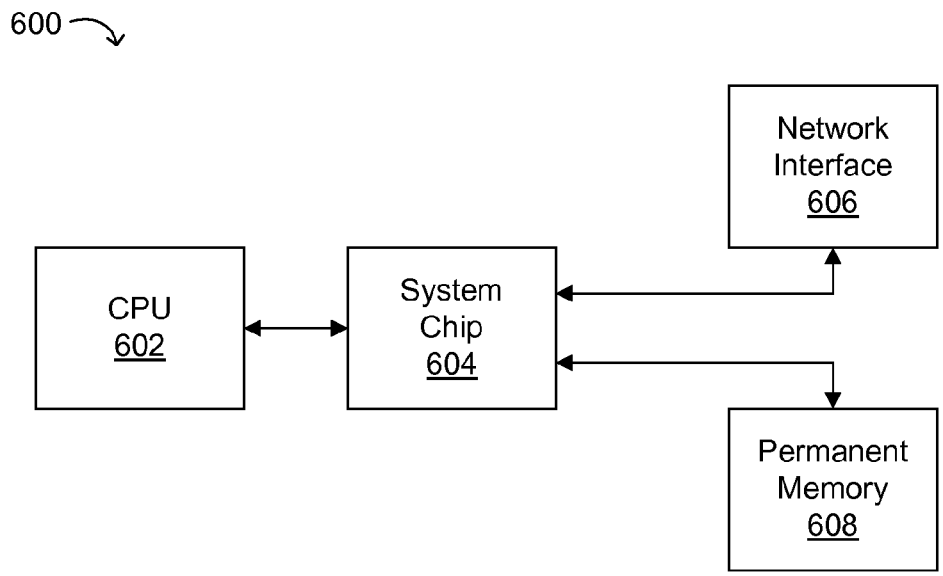
FIG. 6 is a block diagram of an example system with an NIC with a separate log.

Referring now to FIG. 6, shown is a block diagram 600 of an example system with an NIC with a separate log. In this example, central processing unit (CPU) 602 can interface with system chip 604. System chip 604 can interface with network interface 606, and permanent memory 608. CPU 602 can be any general-purpose processor, or microcontroller unit (MCU), and may include one or more of a processor, RAM, ROM, clock, and I/O control circuitry. System chip 604 can include digital, analog, mixed-signal, and/or other functions related to network interfacing and memory access.

In particular embodiments, logging may be performed in parallel with, e.g., a direct memory access (DMA), and a network transfer. In DMA, system memory may be accessed independently of CPU 602, such as via system chip 604, or another device. While such a DMA operation is occurring, network logging can occur by storing data to permanent memory 608. Further, such memory logging can occur along with the DMA operation, and a network transfer (e.g., via network interface 606). In this way, a variety of network and other system memory operations can be supported along with network data memory logging.

Figure 7:
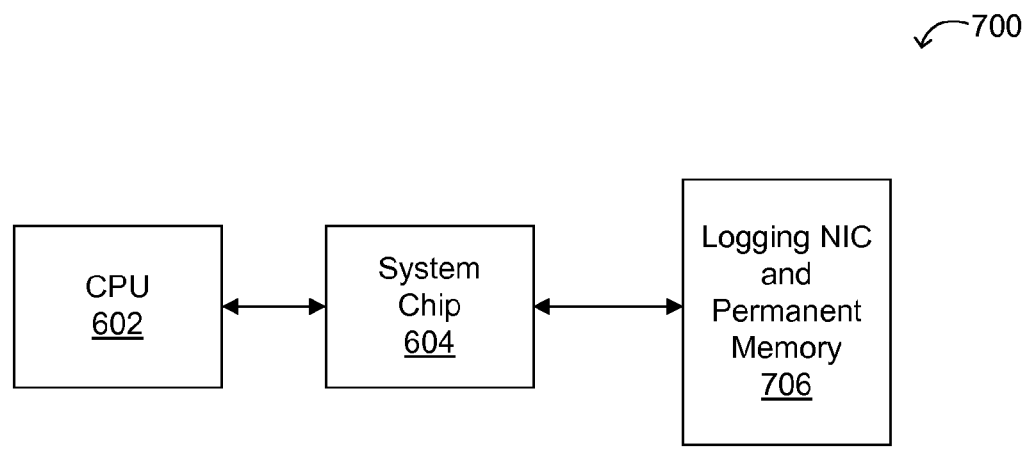
FIG. 7 is a block diagram of an example system with a logging NIC in accordance with embodiments of the present invention.

Referring now to FIG. 7, shown is a block diagram 700 of an example system with a logging NIC in accordance with embodiments of the present invention. In this example, CPU 602 can interface with system chip 604. Also, logging NIC and permanent memory 706 can interface with system chip 604. In this example, the logging NIC and permanent memory 706 may be an integrated unit, or separate chips that are co-located on a same card.

Particular embodiments can provide a log of history of traversing traffic. In addition, data from the log can be read back after a network crash to support recovery operations. For example, direct read/write operations (e.g., via system chip 604) to a memory log (e.g., permanent memory within 706) can be accommodated, to assist in recovering potentially lost data after a network crash. In one example, potentially lost data can be directly read from the permanent memory and stored in a different location for analysis, prior to being resupplied as necessary as part of the recovery.

In addition, the memory log may store network transactions processed in either direction or both directions. Thus, bidirectional traffic through an NIC, or a designated direction (e.g., designated ports, incoming, outgoing, etc.) of an NIC can be allocated for memory logging purposes. Particular embodiments also support a user option or control to enable or disable logging. This may also be done on a port-by-port, direction, or other basis. For example, network data memory logging may be enabled or disabled by a user programmable setting (e.g., in the NIC). Further, a default state, such as to log a maximum amount of traffic can be set and maintained until possibly being overwritten by such user programming or selection.

Figure 8:
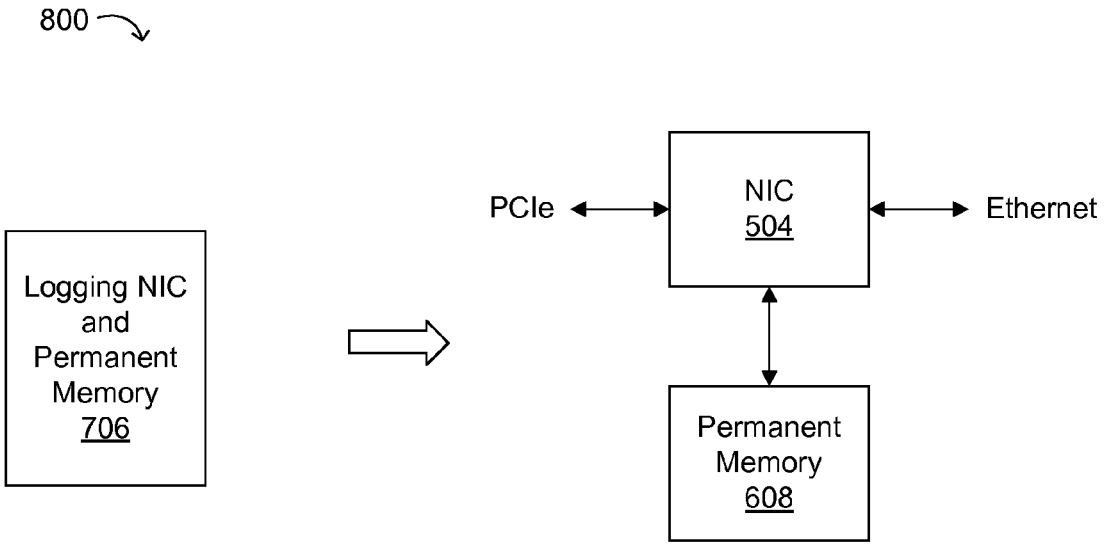
FIG. 8 is a block diagram of example external memory implementation of a logging NIC in accordance with embodiments of the present invention.

Referring now to FIG. 8, shown is a block diagram 800 of example external memory implementation of a logging NIC in accordance with embodiments of the present invention. In this example, logging NIC and permanent memory 706 can be implemented as NIC 504 coupled to permanent memory 608, such as by separate chips on a same card. In this example, NIC 504 may have a peripheral component interconnect express (PCIe) bus interface, and an Ethernet bus interface. PCIe is a computer expansion bus standard that supports maximum system bus throughput, reduced I/O pin counts, performance-scaling for bus devices, a detailed error detection and reporting mechanism (e.g., advanced error reporting (AER)), native hot-plug functionality, and hardware I/O virtualization.

Ethernet is a family of computer network technologies for LANs. Systems that communicate over Ethernet may divide a stream of data into shorter pieces called frames. Each frame can contain source and destination addresses and error-checking data so that any damaged data can be detected and re-transmitted. Particular embodiments may also be suitable to all network types (e.g., InfiniBand switched fabric communications link, Fibre Channel gigabit speed network technology, etc.), as well as to all I/O bus types (e.g., PCIe, Ethernet, etc.).

Figure 9:
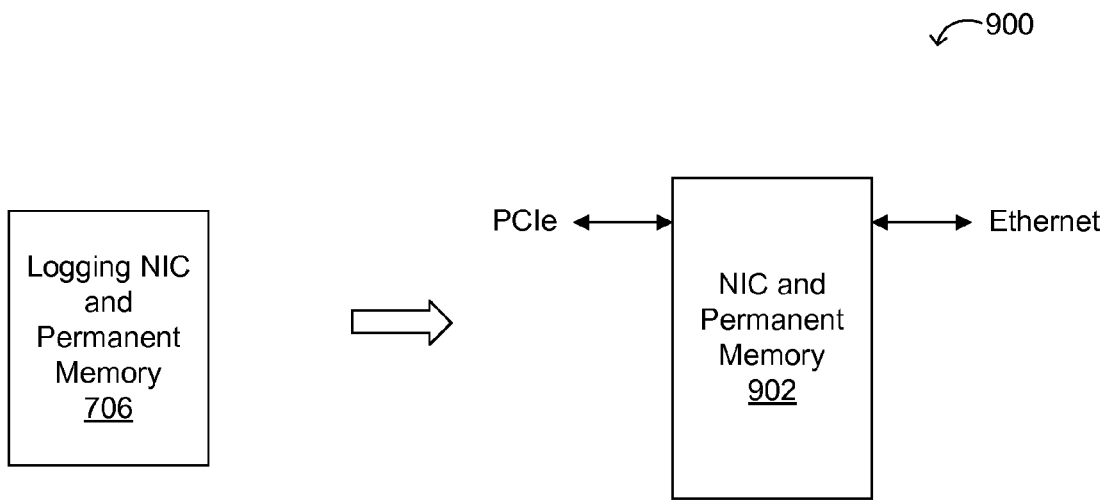
FIG. 9 is a block diagram of example internal memory implementation of a logging NIC in accordance with embodiments of the present invention.

Referring now to FIG. 9, shown is a block diagram 900 of example internal memory implementation of a logging NIC in accordance with embodiments of the present invention. In this example, logging NIC and permanent memory 706 can be implemented as an integrated unit NIC and permanent memory 902. Thus, particular embodiments may be implemented by an external device (e.g., FPGA/ASIC), or integrated with the NIC.

Figure 10:
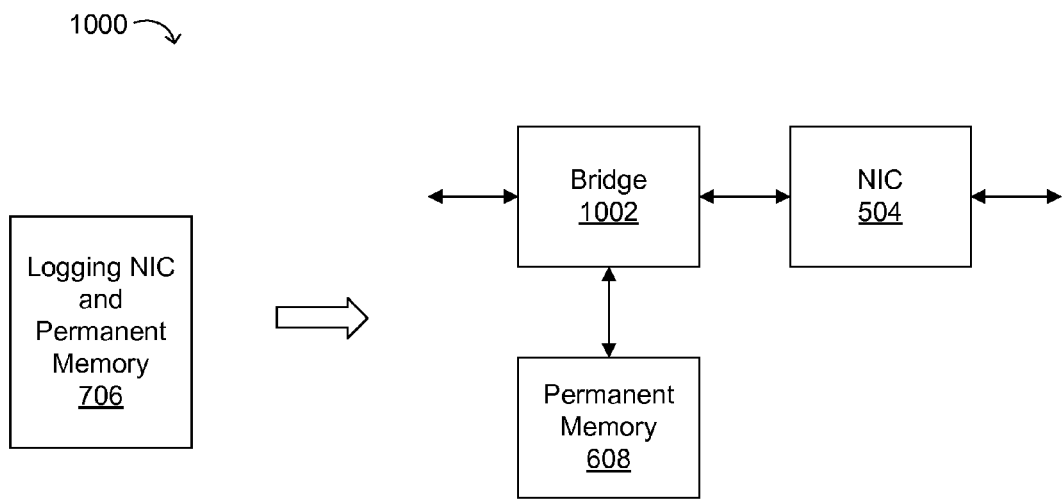
FIG. 10 is a block diagram of an example logging bridge arrangement in accordance with embodiments of the present invention.

Referring now to FIG. 10, shown is a block diagram 1000 of an example logging bridge arrangement in accordance with embodiments of the present invention. In this example, logging NIC and permanent memory 706 can be implemented as bridge 1002 coupled to NIC 504 and permanent memory 608. A bridge can connect two or more LANs or other networks or devices together. A bridge may be relatively fast at transferring data, such as between different protocols (e.g., a token ring and Ethernet network), and may operate at the data link layer or level 2 of the OSI networking reference model.

Permanent memory 608 may represent a memory log, such as for storing network data or transactions to facilitate recovery after a crash. In addition, particular embodiments may support multiple logs that are each configurable in size, and by which operations/addresses may be logged. For example, permanent memory or memory log 608 can include a plurality of memory cells arranged in an array blocks or sectors (e.g., PMC sectors 102). By using such sectors 102, or by combining groups of sectors, or any other grouping of memory cells, memory logs of configurable sizes can be accommodated. In one example, certain types of network data or transactions (e.g., an e-mail) can be designated (e.g., as identified by bridge 1002 or NIC 504) to one memory log or configuration within permanent memory 608, while another type of network data or transaction (e.g., a financial transaction) can be designated to another memory log or configuration within permanent memory 608.

Figure 11:
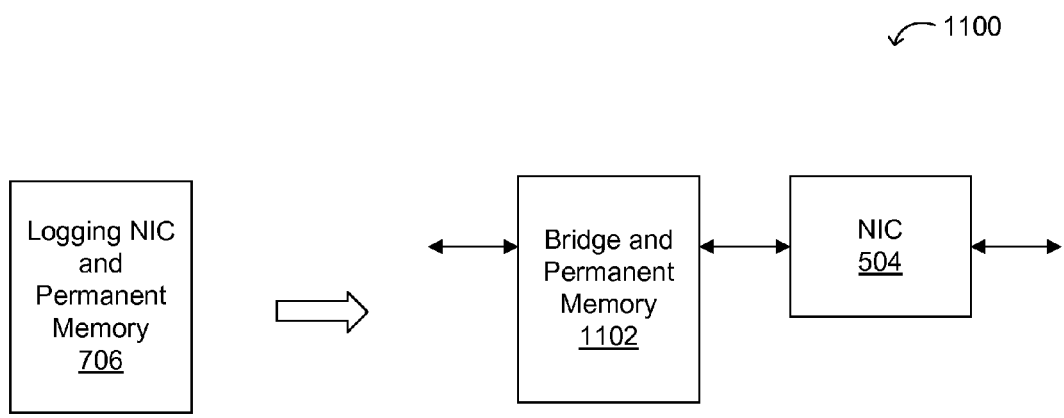
FIG. 11 is a block diagram of an example logging bridge with internal memory, in accordance with embodiments of the present invention.

Referring now to FIG. 11, shown is a block diagram 1100 of an example logging bridge with internal memory, in accordance with embodiments of the present invention. In this example, logging NIC and permanent memory 706 can be implemented as bridge and permanent memory 1102 coupled to NIC 504. Here, bridge and permanent memory 1102 can be integrated, such as on a same IC. Embedded functionality (software and/or hardware) can also be supported in NIC 504. Particular embodiments can also allow for reduced operating system (OS) overhead, bus traffic, software, and copies.

Particular embodiments may also support acknowledgments in the memory log. For example, such acknowledgments can indicate whether particular data has been completely logged, only partially logged, or has some other predetermined log operation status. In addition, message tag and message digest (e.g., cyclic redundancy check [CRC]) can also be supported by the memory log in particular embodiments. Further, the memory log can include ASIC embedded memory or external onboard memory (e.g., as in bridge and permanent memory 1102).

Other types of network devices, buses, controllers, and/or interfaces, can also be supported in particular embodiments. In one embodiment, an apparatus can include: (i) a peripheral component interconnect express (PCIe) bridge configured to receive data, to resend the data, and to send data for logging; (ii) a PCIe device configured to receive the data that is resent from the PCIe bridge; (iii) a memory log coupled to the PCIe bridge, wherein the memory log includes NVM configured to write the data sent for logging from the PCIe bridge; and (iv) where the data being sent for logging by the memory log occurs substantially simultaneously with the data being received by the PCIe bridge, and the data being resent from the PCIe bridge.

Figure 12:
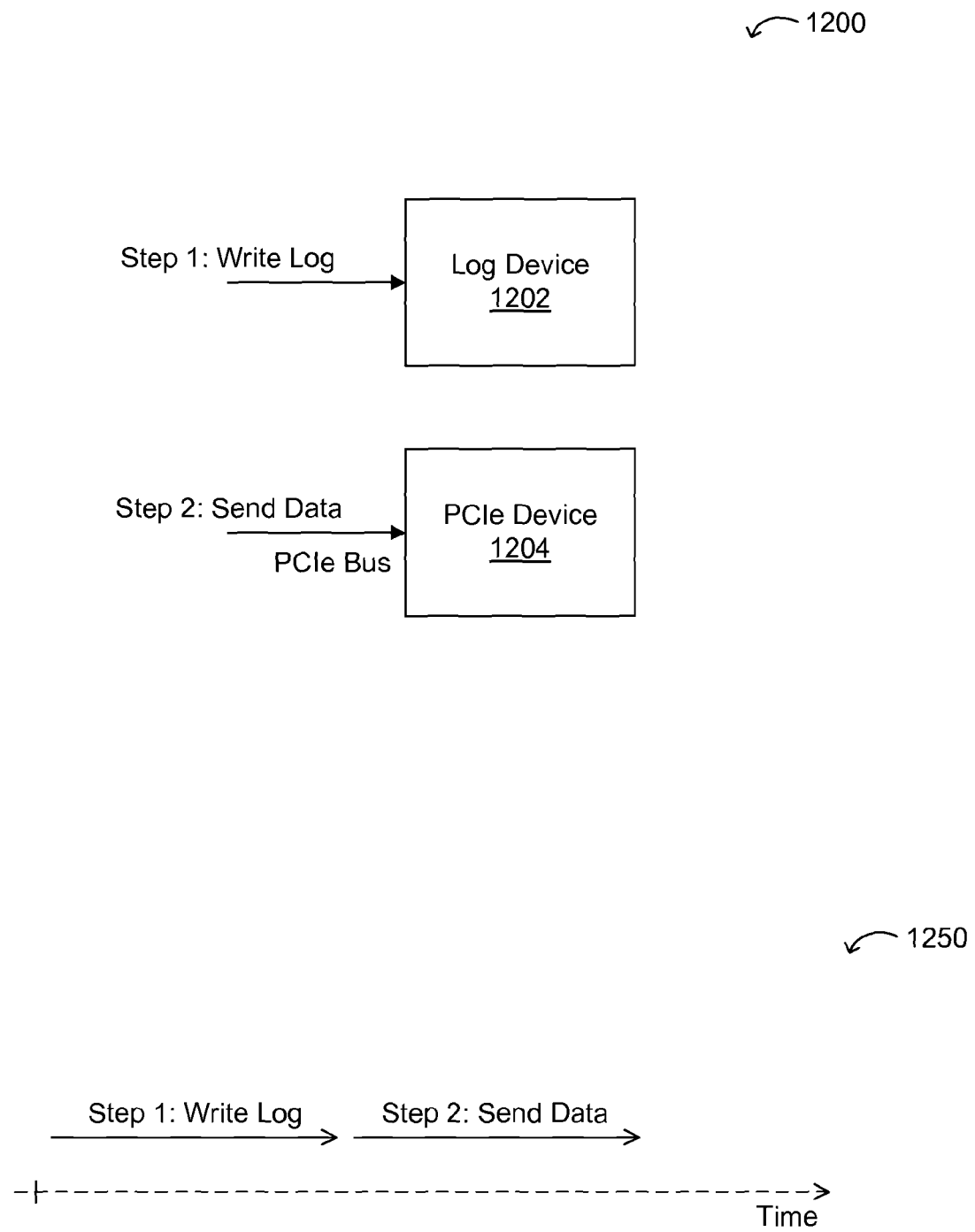
FIG. 12 is a block diagram of an example separate log and PCIe device.

Referring now to FIG. 12, shown is a block diagram of an example separate log and PCIe device. In example 1200, log device 1202 can receive data to write in the log at step 1, and PCIe device 1204 can receive sent data (e.g., on a PCIe bus) at step 2. As discussed above, the write log in step 1 can include data or transactions to be written into a memory log (e.g., log device 1202). Also, "send data" in step 2 can be data sent from another network device (e.g., another PCIe device), and received in PCIe device 1204. In timeline example 1250, the write log step can occur prior to data being sent, as part of a two-step process. Thus, a sequential or non-overlapping logging process is exemplified in this arrangement.

Figure 13:
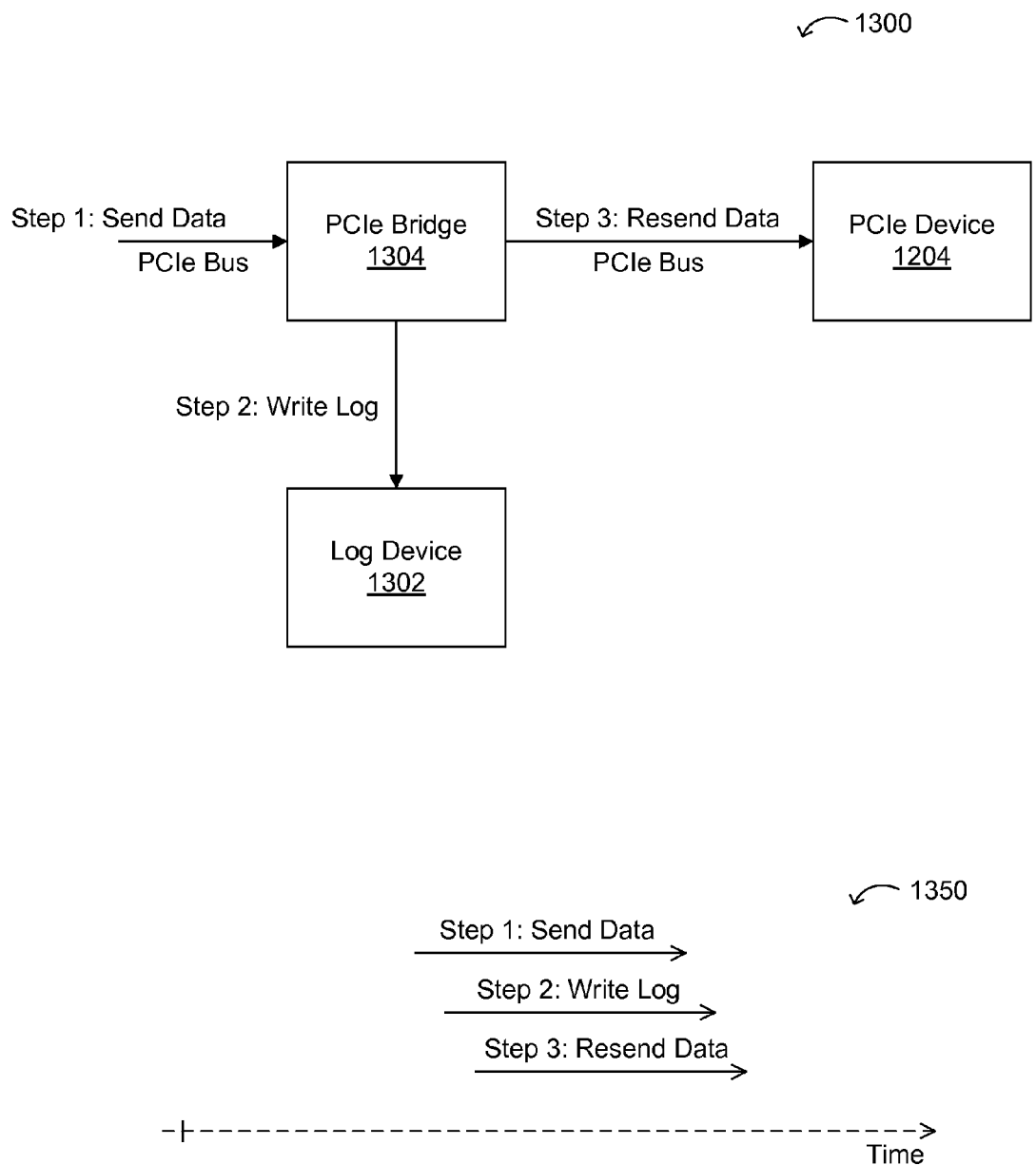
FIG. 13 is a block diagram of an example logging PCIe bridge in accordance with embodiments of the present invention.

Referring now to FIG. 13, shown is a block diagram of an example logging PCIe bridge in accordance with embodiments of the present invention. In example 1300, PCIe bridge 1304 can receive sent data at step 1, and may send data for writing to log device 1302 in step 2. Step 3 can include resending data from PCIe bridge 1304 to PCIe device 1204 along a PCIe bus. For example, "resend data" in step 3 can include a resending of the same data, or a substantial portion of that data, received in PCIe bridge 1304 in step 1. In timeline example 1350, the steps of sending data, writing the log, and resending the data can occur substantially simultaneously as one overlapping step. Thus in this example, the steps of sending data, writing the log, and resending the data, can at least partially overlap in time. In this way, network logging for PCIe bridges and devices can be supported with reduced latency and improved network performance.

Figure 14:
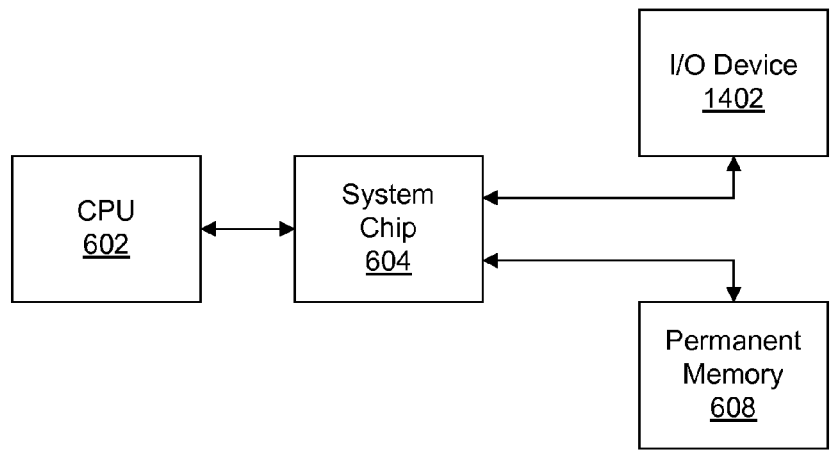
FIG. 14 is a block diagram of an example system with a separate log structure.

Referring now to FIG. 14, shown is a block diagram 1400 of an example system with a separate log structure. In this example, CPU 602 can interface with system chip 604. System chip 604 can also interface with I/O device 1402 and permanent memory 608. This example represents permanent memory 608 that is separated from other devices in system 1400.

Figure 15:
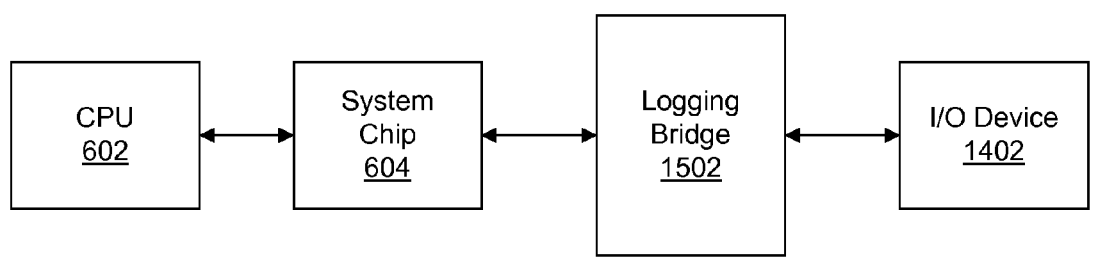
FIG. 15 is a block diagram of an example bridge on a motherboard in accordance with embodiments of the present invention.

Referring now to FIG. 15, shown is a block diagram 1500 of an example bridge on a motherboard in accordance with embodiments of the present invention. In this example, CPU 602 can interface with system chip 604. Logging bridge 1502 can interface with system chip 604 and I/O device 1402. Here, logging bridge 1502 can include a memory log therein to facilitate the simultaneous writing of the memory log while data flows through the logging bridge. In this way, network data or transaction logging can be facilitated, such as to improve recovery operations in the event of network failure.

Figure 16:
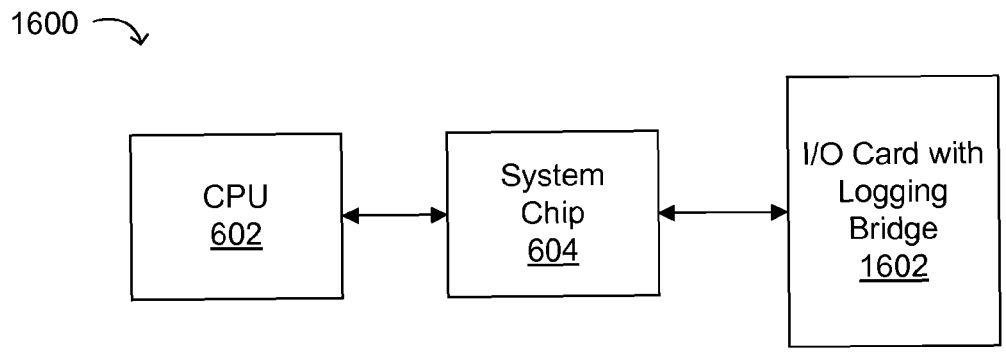
FIG. 16 is a block diagram of an example bridge on an I/O card in accordance with embodiments of the present invention.

Referring now to FIG. 16, shown is a block diagram 1600 of an example bridge on an I/O card in accordance with embodiments of the present invention. In this example, system chip 604 can interface with CPU 602, and I/O card with logging bridge 1602. Thus, further integration of logging operations can occur with both a bridge and an I/O card. In this way, faster memory log operations can be supported, relative to less integrated approaches.

Various methods of substantially simultaneously writing a memory log along with processing data flow or transactions through a network device can be accommodated in particular embodiments. In one embodiment, a method can include: (i) receiving data in a NIC; (ii) logging data from the NIC by writing data in a memory log, wherein the memory log includes NVM for writing the data for logging from the NIC; and (iii) transmitting data from the NIC, where the data is received by the NIC, the data is transmitted from the NIC, and the data is written for logging by the memory log substantially simultaneously.

Figure 17:
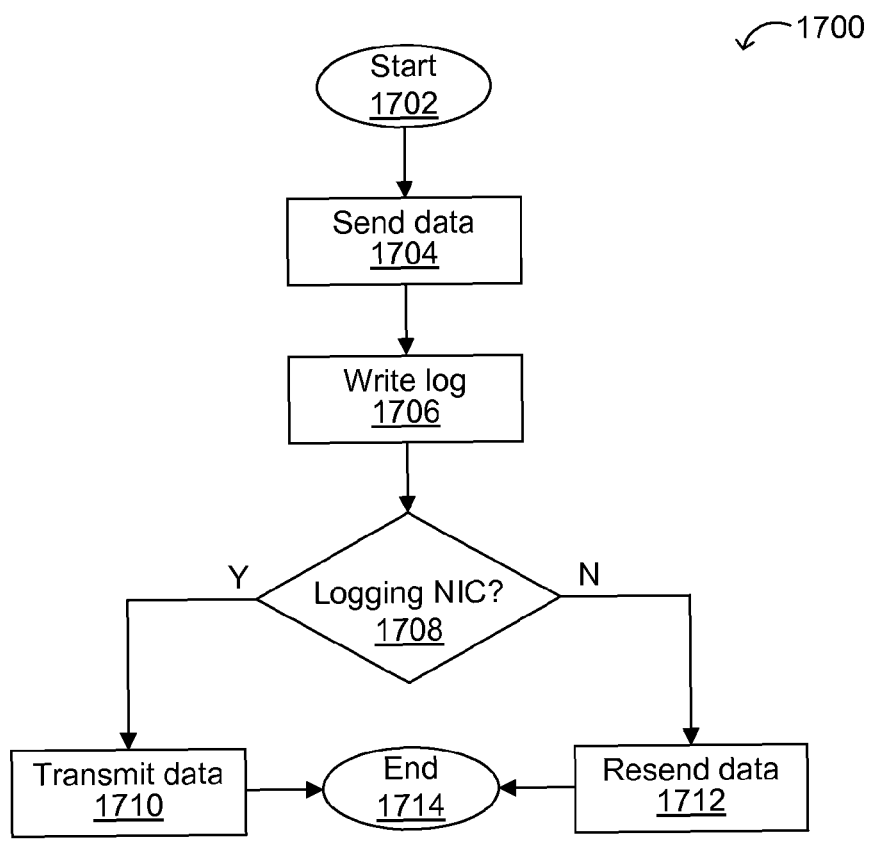
FIG. 17 is a flow diagram of an example logging method in accordance with embodiments of the present invention.

Referring now to FIG. 17, shown is a flow diagram 1700 of an example logging method in accordance with embodiments of the present invention. The flow begins at 1702, and data is sent at 1704. At 1706, data can be written to the memory log. If it is a logging NIC (1708), data can be transmitted at 1710, completing the flow at 1714. However, if it is not a logging NIC (1708), such as a logging PCIe bridge, data can be resent at 1712, completing the flow at 1714. The steps of sending data at 1704, writing the log at 1706, and transmitting/resending the data at 1710/1712, can all occur substantially simultaneously. Further, the steps of transmitting data 1710 and resending data 1712 can be a same step in some applications.

Particular embodiments are also suited for various types of memory arrangements and storage states. In one example, while only two storage states (state "0" and state "1") have been significantly described herein with respect to the memory cells, PMCs may also each support more than one memory state. For example, depending on the voltage level controls, instead of a full erase or a full program/write, partial operations (e.g., by applying less/predetermined voltages for forward bias and reverse bias of the PMC) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance and bias voltage characteristics.

While the above examples include circuit and structural implementations of certain memory cells and programmable impedance devices, one skilled in the art will recognize that other technologies, methods, and/or cell structures can be used in accordance with various embodiments. Further, one skilled in the art will recognize that other device circuit arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus, comprising:
   a) a network interface card (NIC) configured to receive data, to transmit data, and to send data for logging;
   b) a memory log coupled to the NIC, wherein the memory log comprises resistive switching non-volatile memory (NVM) configured to write the data sent for logging from the NIC; and
   c) wherein the data being sent by the NIC for logging in the memory log occurs to at least partially overlap operations with the data being received by the NIC, and the data being transmitted from the NIC, and wherein initiation of the data being sent by the NIC for logging in the memory log occurs prior to initiation of the data being transmitted from the NIC.

2. The apparatus of claim 1, wherein the NIC is configured to begin transmit of the data while the memory log writes the data for logging from the NIC.

3. The apparatus of claim 1, wherein the memory log and the NIC are integrated on a same network card.

4. The apparatus of claim 3, wherein the memory log and the NIC are integrated on a same chip in the network card.

5. The apparatus of claim 1, wherein the data received by the NIC comprises a peripheral component interconnect express (PCIe) standard, and the data transmitted from the MC comprises an Ethernet standard.

6. The apparatus of claim 1, further comprising a bridge coupled between the NIC and the memory log.

7. The apparatus of claim 1, wherein the resistive switching NVM comprises a conductive bridging random-access memory (CBRAM) having a plurality of memory cells.

8. The apparatus of claim 7, wherein each of the plurality of memory cells comprises:
   a) a programmable impedance element having an inert electrode, and an active electrode that is coupled to a bit line; and
   b) a transistor having a drain coupled to the inert electrode a gate coupled to a word line, and a source coupled to a source line.

9. The apparatus of claim 8, wherein the programmable impedance element comprises:
   a) the inert electrode coupled to a first side of a solid electrolyte;
   b) the active electrode coupled to a second side of the solid electrolyte, wherein the programmable impedance element is programmed by formation of a conductive path between the active and inert electrodes; and c) a plurality of mobile elements derived from the active electrode, wherein the plurality of mobile elements are reduced in the solid electrolyte to form the conductive path.

10. The apparatus of claim 9, wherein:
a) the conductive path in the programmable impedance element is formed by application of a first voltage across the active and inert electrodes, the conductive path substantially remaining once formed after the first voltage is removed; and
b) at least a portion of the conductive path is dissolved to erase the programmable impedance element by application of a second voltage across the active and inert electrodes.

11. An apparatus, comprising:
a) a peripheral component interconnect express (PCIe) bridge configured to receive data, to resend the data, and to send data for logging;
b) a PCIe device configured to receive the data that is resent from the PCIe bridge;
c) a memory log coupled to the PCIe bridge, wherein the memory log comprises resistive switching non-volatile memory (NVM) configured to write the data sent for logging from the PCIe bridge; and
d) wherein the data being sent by the PCIe bridge for logging in the memory log occurs to at least partially overlap operations with the data being received by the PCIe bridge, and the data being resent from the PCIe bridge, and wherein initiation of the data being sent by the PCIe bridge for logging in the memory log occurs prior to initiation of the data being transmitted from the PCIe bridge.

12. The apparatus of claim 11, wherein the PCIe device is configured to begin receiving the resend data while the memory log writes the data for logging from the PCIe bridge.

13. The apparatus of claim 11, wherein the PCIe bridge is configured to receive the data on a first PCIe bus, and to resend the data on a second PCIe bus.

14. The apparatus of claim 11, wherein the resistive switching NVM comprises a conductive bridging random-access memory (CBRAM) having a plurality of memory cells.

15. The apparatus of claim 14, wherein each of the plurality of memory cells comprises:
a) a programmable impedance element having an inert electrode, and an active electrode that is coupled to a bit line; and
b) a transistor having a drain coupled to the inert electrode a gate coupled to a word line, and a source coupled to a source line.

16. The apparatus of claim 15, wherein the programmable impedance element comprises:
a) the inert electrode coupled to a first side of a solid electrolyte;
b) the active electrode coupled to a second side of the solid electrolyte, wherein the programmable impedance element is programmed by formation of a conductive path between the active and inert electrodes; and
c) a plurality of mobile elements derived from the active electrode, wherein the plurality of mobile elements are reduced in the solid electrolyte to form the conductive path.

17. The apparatus of claim 16, wherein:
a) the conductive path in the programmable impedance element is formed by application of a first voltage across the active and inert electrodes, the conductive path substantially remaining once formed after the first voltage is removed; and
b) at least a portion of the conductive path is dissolved to erase the programmable impedance element by application of a second voltage across the active and inert electrodes.

18. A method, comprising:
a) receiving data in a network interface card (NIC);
b) logging data from the NIC by writing data in a memory log, wherein the memory log comprises resistive switching non-volatile memory (NVM) for writing the data for logging from the NIC; and
c) transmitting data from the NIC, wherein the data is received by the NIC, the data is transmitted from the NIC, and the data is written for logging in the memory log to at least partially overlap operations, wherein initiation of the data being sent by the NIC for logging in the memory log occurs prior to initiation of the data being transmitted from the NIC.

19. The method of claim 18, wherein the NIC begins transmitting the data while the memory log is writing the data for logging from the NIC.

20. The method of claim 18, wherein the memory log and the NIC are integrated on a same network card.

* * * * *